US008910100B1

(12) United States Patent
Wilson et al.

(10) Patent No.: US 8,910,100 B1
(45) Date of Patent: Dec. 9, 2014

(54) SYSTEM AND METHOD FOR AUTOMATICALLY RECONFIGURING CHAIN OF ABUTTED DEVICES IN ELECTRONIC CIRCUIT DESIGN

(71) Applicant: Cadence Design Systems, Inc., San Jose, CA (US)

(72) Inventors: Thomas Wilson, Glasgow (GB); Arnold Ginetti, Antibes (FR); Kenneth Ferguson, Edinburgh (GB); Yuan-Kai Pei, Taipei (TW)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/337,880

(22) Filed: Jul. 22, 2014

(51) Int. Cl.
*G06F 9/455* (2006.01)
*G06F 17/50* (2006.01)

(52) U.S. Cl.
CPC ........ *G06F 17/5081* (2013.01); *G06F 17/5072* (2013.01)
USPC ........... 716/112; 716/101; 716/102; 716/103; 716/106; 716/111; 716/119; 716/126

(58) Field of Classification Search
USPC ........ 716/101, 102, 103, 106, 111, 112, 119, 716/126
See application file for complete search history.

(56) References Cited

U.S. PATENT DOCUMENTS

| | | | |
|---|---|---|---|
| 7,193,432 B1 * | 3/2007 | Schmit et al. | 326/38 |
| 8,707,236 B2 * | 4/2014 | Romani et al. | 716/118 |
| 2008/0066027 A1 * | 3/2008 | Mantik et al. | 716/5 |
| 2010/0257497 A1 * | 10/2010 | Mallon et al. | 716/5 |
| 2012/0210290 A1 * | 8/2012 | Liu et al. | 716/132 |
| 2012/0303855 A1 * | 11/2012 | Bakke et al. | 710/308 |

* cited by examiner

*Primary Examiner* — Brian Ngo
(74) *Attorney, Agent, or Firm* — Rosenberg, Klein & Lee

(57) ABSTRACT

The subject system and method are generally directed to the user-friendly insertion of at least one device, and optionally chains of devices, into at least one pre-existing chain of interconnected devices within a graphical representation of a circuit design such as a circuit layout, circuit mask, or a schematic. The system and method provide for discerning the intended insertion points and performing remedial transformations of the devices within the chains to ensure compliance with both structural and operational requirements of the circuit design.

20 Claims, 10 Drawing Sheets

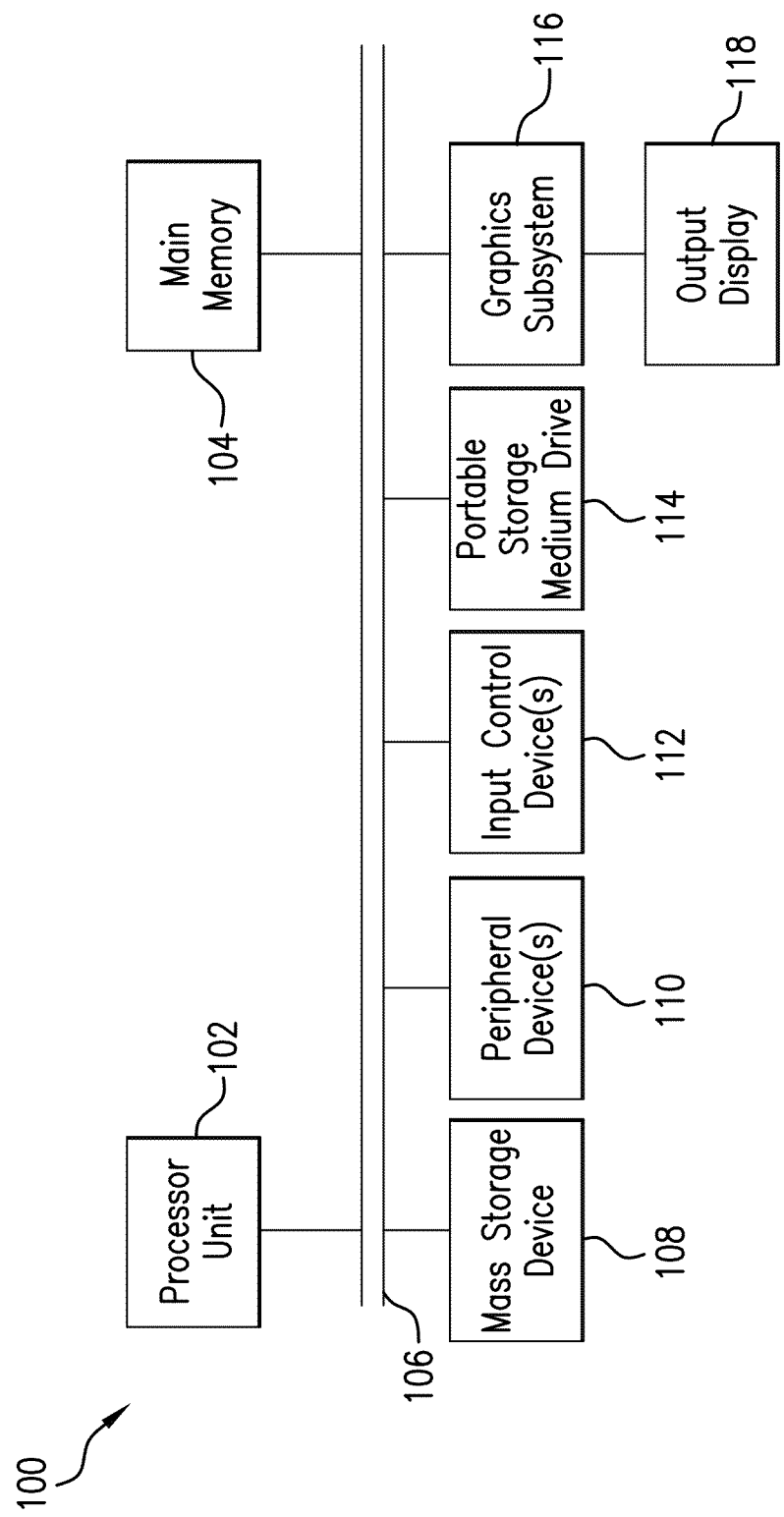

SYSTEM AND METHOD FOR AUTOMATICALLY RECONFIGURING CHAIN OF ABUTTED DEVICES IN ELECTRONIC CIRCUIT DESIGN

BACKGROUND OF THE INVENTION

The present invention is generally directed to a system and method for automatic reconfiguration of a chain of interconnected devices within an electronic circuit design. More specifically, a system and method are provided for user-friendly insertion of at least one device, and optionally a chain (or chains) of devices, into a pre-existing chain (or chains) of interconnected devices within a graphical representation of a circuit design such as a circuit layout, circuit mask, circuit schematic, or the like within an electronic design automation (EDA) tool in rule-compliant manner.

Presently, a given circuit design may incorporate upwards of tens of billions of transistors or more. Moore's law has established a timeline of a doubling of transistors in a given Integrated Circuit (IC) product-line every 18 months. As circuit complexity and transistor counts continue to exponentially grow, circuit design becomes much more challenging and demanding. For circuit designers to successfully insert, modify, interconnect, and remove devices such as transistors into complex functional structures such as logic arrays, chains, and the like to fit within a circuit design, design teams have to expend substantial time and effort.

Further exacerbating such operations is the fact that many devices in these structures are arranged in abutted relation with each other. By abutment, space-saving and wire-routing savings measure are realized in circuit designs whereby two or more devices share common portions rather than each having their own dedicated functional portions. For example, two (or several) devices such as transistors may be integrally formed into a chain or other structure where a plurality of devices may all share a common drain or source portion or the like. In chains of greater numbers of devices, identification of individual devices may be difficult as portions may be communally shared on multiple sides with other devices. Moreover, distinguishing portions which normally delineate devices, such as metal contacts, may be omitted. A simplified illustration of an abutted chain of devices 300 may be seen in FIG. 3.

When a change is made to a circuit design, there is a risk of a designer inadvertently introducing mistakes—the remedy for which may require additional unnecessary design flow iterations from design to verification and back. In a system with great numbers of transistors arranged in intricate and integral functional structures, even a minor mistake may have significant adverse impact on the operation of the given circuit. Worse yet, if the mistake is not detected and properly remedied by verification systems, a defective integrated circuit product may be fabricated.

Conversely, even incremental savings in circuit design tasks aggregated throughout the industry may save substantial time and money and result in better integrated circuit (IC) products. When the measures for more efficiently performing such tasks also reduce the likelihood of errors, the savings may be substantial.

In systems heretofore known for circuit design, where a pre-established chain of interconnected devices in a circuit design requires the intermediate insertion of another device or chain, a designer must perform a number of time-consuming and error-prone operations beginning with manually initiating deconstruction of the devices from the chain. This is all the more difficult in a chain of mutually abutted devices with neighboring devices sharing overlapping portions. Modifying an abutted pre-existing chain includes actuating a processor and effecting a memory-intensive abutment removal procedure whereby devices are un-abutted one from the other and their individual functional portions are each re-created. Space must then be allocated within the series of un-abutted devices by shifting a portion thereof, moving the new device into the allocated space, and transforming one or more devices such as by reorienting, reordering, or permuting to allow for compatible interface and re-abutment in compliance with both structural and operational requirements of the circuit design (permute operations generally involve the swapping of source and drain portions on a single device). Only once transformed could the chain then be reconstructed in abutted relation to incorporate the new device/s. The chain of devices would then need to be re-routed into the circuit design to interconnect with other devices, power, ground, and signal sources and outputs. Any errors or mistakes introduced would then need to be remedied in an iterative redesign, simulation, and re-verification loop. Such approach is not efficient and unduly prone to error.

There is therefore a need for a system and method for automatic reconfiguration of a chain of devices within a circuit design tool.

There is therefore a need for a system and method by which a circuit designer may insert a device (or chains of devices) into a chain (or chains) of devices within a circuit design tool in automated and efficient manner while avoiding the introduction of structural and operational violations.

SUMMARY OF THE INVENTION

It is an object of the present invention to provide a system and method for insertion of a new device into a pre-existing chain of interconnected devices within a circuit design.

It is yet another object of the present invention to provide a system and method for automated reconfiguration of a pre-existing device chain by inserting intermediately therein another device or device chain(s) while adhering to applicable circuit design rules.

These and other objects are attained in a system and method formed in accordance with certain embodiments of the present invention. In one exemplary embodiment, a method for automatically reconfiguring a chain of interconnected devices established in a circuit design according to a set of predefined design requirements includes executing a computer processor to graphically render a plurality of devices, including the chain of interconnected devices and a circuit portion on a display for integration intermediately into the chain. The circuit portion includes at least one electronic device. At least one of the graphically rendered plurality of devices are moved to visually superimpose at least a portion of another device one over the other according to a user indication of a desired insertion region within the chain. At least one edge overlap is detected between the circuit portion and the chain, the edge overlap being defined by an edge of the circuit portion and an intermediate portion of the chain being disposed in superimposed relation. An insertion point is selectively determined responsive to the detected edge overlap on the intermediate portion of the chain within the desired insertion region, the insertion point indicating at least one interconnection node between interconnected electronic devices of the chain. A plurality of chain segments within the chain are defined, the chain segments being interconnected at each interconnection node indicated by the insertion point. The circuit portion is inserted between the chain segments, and interconnection is generated between the circuit portion and chain segments to form a reconfigured chain.

Another exemplary system for automatically reconfiguring a chain of interconnected devices established in a circuit design according to a set of predefined design requirements includes executing a user interface module to graphically render, on a display, a plurality of devices, including the chain of interconnected devices and a circuit portion for integration intermediately into the chain. The circuit portion includes at least one electronic device. A movement module is operably coupled to the user interface module and executes to move at least one of the graphically rendered plurality of devices to visually superimpose at least a portion of one over another device according to a user indication of a desired insertion region within the chain. A mapping module executes to detect at least one edge overlap between the circuit portion and the chain, the edge overlap being defined by an edge of the circuit portion and an intermediate portion of the chain being disposed in superimposed relation. An insertion point is selectively determined responsive to the detected edge overlap on the intermediate portion of the chain within the desired insertion region, the insertion point indicating at least one interconnection node between interconnected electronic devices of the chain. A chain transformation module executes to define a plurality of chain segments within the chain, the chain segments being interconnected at each interconnection node indicated by the insertion point. The circuit portion is inserted between the chain segments, and interconnection is generated between the circuit portion and chain segments to form a reconfigured chain.

An exemplary method for automatically reconfiguring a chain of interconnected devices established in a circuit design according to a set of predefined design requirements includes executing a processor to graphically display the circuit design having a plurality of devices including at least the chain and a circuit portion for integration intermediately into the chain. The circuit portion including at least one electronic device. The circuit portion, responsive to a user instruction, is moved into a superimposed overlapping relation with the chain at an intermediate portion thereof to generate at least one violation of the set of predefined design requirements. The at least one violation is identified; the violation referencing a terminal of an overlapped device of the chain and a terminal of a device of the circuit portion overlapping the device of the chain. A map is generated identifying a physical placement order of devices constituting the chain. A designated insertion point of the circuit portion within the chain is identified in the map according to the at least one identified violation. The devices in the map are reordered according to the predefined design requirements and the designated insertion point of the circuit portion within the pre-existing chain. The chain is automatically reconfigured by disconnecting at least two interconnected devices of the chain and interposing for interconnection the circuit portion therewithin according to the ordered map, the devices of the chain and the circuit portion being arranged in requirement-compliant manner.

BRIEF DESCRIPTION OF THE DRAWINGS

FIG. 1 is a schematic block diagram illustrating an exemplary computer system for programmatic implementation of certain embodiments of the present invention;

FIG. 2-1 is an illustrative flow diagram showing a general flow of processes in accordance with an exemplary embodiment of the present invention;

FIG. 2 is an illustrative flow diagram illustrating a flow of processes in accordance with an exemplary embodiment of the present invention as applied to a certain application;

DETAILED DESCRIPTION OF THE PREFERRED EMBODIMENTS

The subject system and method are generally directed to the highly automated insertion of at least one device, and optionally a chain of devices (or chains of devices), into a given chain (or chains) of interconnected devices within a graphical representation of a circuit design such as a circuit layout, circuit mask, circuit schematic, or the like. In a typical application, the given device chain (denoted 'pre-existing' for convenient reference purposes) and an additional device or chain to be inserted are selectively identified by a user, along with general indication of where on the pre-existing chain the insertion is desired. The system and method then automatically actuate the intervening processes necessary to effect the insertion, and thereby reconfigure the pre-existing chain of devices accordingly. For example, the system and method automatically determines one or more appropriate insertion points on the pre-existing device chain at the generally indicated region for insertion, automatically actuates decomposition of the pre-existing chain at an insertion point, then carries out the insertion and interconnection with the decomposed portions of the pre-existing device chain. The system and method do so while automatically monitoring and actuating remedial action (such as remedial transformations of devices within the given chain(s)) to preserve compliance with both structural and operational requirements of the circuit design (suitably expressed, for instance, through applicable rules). The system and method thus obviate the need for a user to manually direct such intervening processes for device/chain insertion into a pre-existing device chain.

Figure 3:
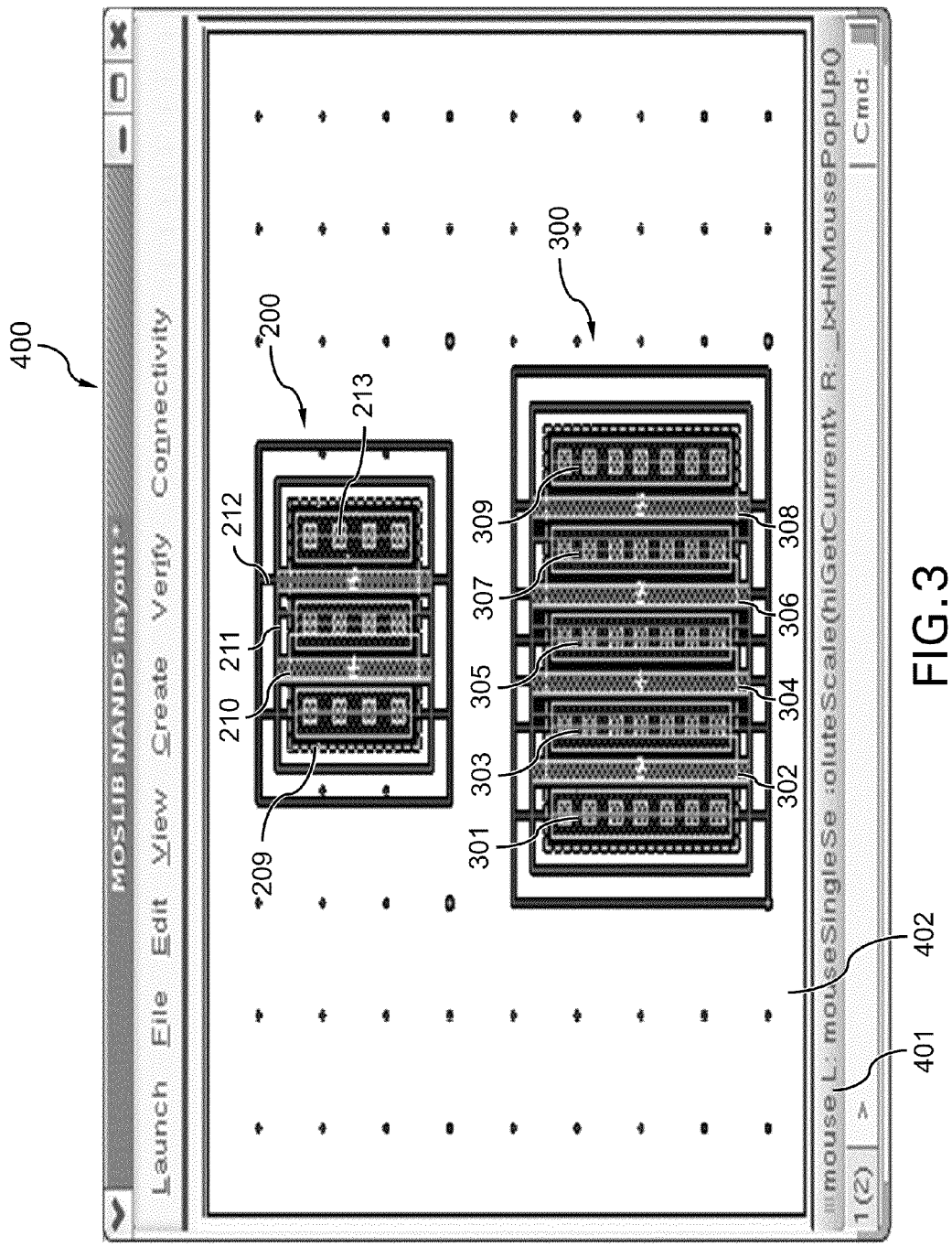
FIG. 3 illustrates an exemplary user interface including a graphical layout of a circuit design including two chains of transistor devices in accordance with an exemplary embodiment of the present invention.

FIG. 3 illustrates an example of a graphical user interface 400 generated for a circuit design application programmably implemented in accordance with an exemplary embodiment of the present invention. A graphical representation of a first chain of devices 300 is shown within the user interface 400. In this example, the first device chain 300 includes a plurality of devices that are interconnected by abutment, where a conductive member is shared by adjacent devices to concurrently serve as a terminal of each. The user interface 400 may provide a working space 402 which allows a user to insert, manipulate, and remove devices and interconnections therebetween in the circuit design. The first chain 300 includes a plurality of devices such as, for example, transistors 302, 304, 306, and 308 (for brevity and clarity, each transistor is indexed by its centrally disposed gate, e.g., 302, however, the gate is generally flanked by a source region, e.g., 301 on one side and a drain region, e.g., 303 on the other side). Chains may be formed by a number of circuit devices/elements/objects, such as transistors, through a representation of circuit components, such as parameterized cells (PCELLS), and quick cells (QCELLS), or any other suitable device amenable to a chained, interconnected, or abutted disposition. In the present example, the plurality of transistors 302-308 are arranged in abutted relation.

Abutment is generally established where two pins (of different device instances) connected to the same net on the same (or equivalent) circuit design layer are brought into an overlapping relationship. Abutment of devices allows plural adjacent devices to share common constituent elements with one another, elements such as a diffusion region, a contact, metal tabs, a common drain, a common source, a shared drain/source, or any other element combined in an instance pin according to a pre-established net list of intended interconnections and other rules of the design/device. This beneficially serves to reduce required surface area for circuit components and the required routed wire segments for their interconnection within the circuit design to allow more free space for other components and to reduce parasitics and other phenomena. The abutment also increases production yields, decreases costs, and facilitates smaller circuit products. In an abutted relation, two adjacent devices such as transistors 302 and 304 may share one or more of a common interface regions, contacts, drains, or source portions 303 rather than having separate and independent portions with a mandatory offset space maintained therebetween to comply with design rule constraints. In similar manner, the devices may omit certain other components ordinarily required for spaced (non-abutted) relation such as metal contact layers and the like. Contacts, for example, may or may not be dropped when devices abut. Certain pre-established rules preferably define when contacts are suppressed and the devices themselves may parametrically define whether contacts or other portions are to be dropped or not. The devices may also define different behaviors for these common element portions based on different arrangements or configurations such as abutment or un-abutment.

Devices which are disposed in spaced relation in a circuit design are interconnected typically with a wire segment or other conductive path medium. To facilitate interconnection between each of the devices to the wire path, the devices are each generally provided with a surface layer of contact fingers or pads. However, when two devices are arranged in abutted relation, such external contact pads may be omitted as the two devices will overlap to a degree in at least partially superimposed/juxtaposed/intersecting relation and therefore no routing wire or contacts may be necessary. Each device is generally modelled in an electronic design automation (EDA) flow with its own constituent elements or portions. However, when devices are arranged in abutment, at least one of the abutted elements are preferably suppressed from graphical rendering in design tools and ultimate fabrication though the suppressed element is retained in the data structure representing the device for use in the event that the device is removed from an abutted relation. Alternatively, a portion of each of the abutted elements may be suppressed to form a complementary element. For example, a portion of at least one device's contact portions may be suppressed such that only when the two devices are combined is the full element present.

Generally, a device such as a field effect transistor has a plurality of elements or portions including a gate, a drain, a source, contacts, wells, substrate, and the like. Depending upon the specific technology used, the portions may be different. In the case of bipolar junction transistor devices (as opposed to field effect transistor devices), for instance, the portions would include emitter, collector, and base. It is often beneficial, such as in the construction of logic gates, to combine a plurality of transistors or other devices in a predetermined manner. This combination of devices may be accomplished by sharing elemental regions of devices, such as drain regions, source regions, or respective source and drain of devices together in abutted relation. Where two transistors share a common drain or a common source, they may be considered in parallel disposition. On the other hand, where two devices have a source coupled to a drain, this may be considered to be a serial disposition.

When a plurality of devices are to be combined together in abutted relation, a number of different device order/orientation arrangements are generally possible. An optimization/solver process such as, for example, an auto-placer/router, chaining engine/API, or the like is undertaken to determine the most beneficial or least-cost arrangement. The plurality of different arrangements of abutted overlapping sources and drains of devices are evaluated based on a number of factors such as: wafer space savings, parasitic effects, and also the routing required to interconnect with other devices outside of the chain. For example, as seen in a representation of a second chain of devices 200, when two transistor devices 210 and 212 are combined together with a common drain 211, there will be two source regions 209 and 213 for the two devices respectively at outside extremes of the chain. Connecting those source regions 209 and 213 with a certain node on the one hand, and connecting the common drain 211 with another node on the other hand may be accomplished with a number of different geometric routed interconnect paths. The plurality of different paths may be evaluated in this optimization process to determine the most beneficial or cheapest (according to a predetermined combination of cost factors) and the user may be prompted or provided with input as to the possible choices for arrangement of the devices and routing.

A circuit design is generally dictated by requirements in the form of design rules and constraints which impose, amongst other things, certain minimum and maximum spacing between devices, wire segments, and edges of a circuit board, a prohibition of overlaps of device instances, and the like. Where these requirements are not met, a structural violation is indicated which identifies at least the location of the violation, and preferably the identities of devices or wire segments involved in the structural violation. For example, when terminals of two respective devices (A and B) overlap, a structural violation is created which identifies device A, device B, and preferably their terminal portions where the overlap is located. Additionally, the structural violation may reference a coordinate or coordinate range of the overlap, such as position (x, y, z) or (x, y) at layer 9. The metric for location may be specified in pixels, microns, micrometers, or any other suitable unit for measurement to convey location to a circuit designer.

A net list or other data structure may further impose intended interconnections between pins or contacts of devices. For example, a net list may specify that pin 1 of device 1 shall interconnect to pin 1 of device 2. As another example, the net list may specify that pin 1 of device 1, pin 1 of device 2, and pin 1 of device 3 shall connect to ground. A technology library may have further device-level restrictions and constraints related to abutment, chaining, or other electrical or operating parameters. Preferably, where such requirements are not met, an operational violation is generated. The operational violation preferably indicates at least the requirement violated, an identity of devices (and portions thereof) involved in the violation, a location of the violation, and other such pertinent information to assist the circuit designer in remedying the violation. The overlap example of device A and B (set forth above) which triggers a structural violation may additionally trigger operational violations (if, for example, the overlapped terminals are pre-defined to connect to different nets).

Generally, a connectivity extractor or other such suitable module scans the circuit design (or portions thereof) for structural and operational violations periodically, manually, and responsive to editing operations. When the connectivity extractor locates a violation of a requirement, it selectively executes to create structural or operational violation (as the case may be). The violation is generally a data structure or class with a set of data fields and functions which is retrievable or passable to certain helper functions meant to help diagnose and remedy the violations. Additionally, the connectivity extractor preferably generates an indicator mechanism such as a global flag that alerts helper functions to the existence of violations. The violations may then be passed to the helper functions, or the helper functions may selectively retrieve the violations for remediation.

An abutment violation involves at least one structural violation due to an overlap of elemental portions of two devices. In some instances, an abutment violation may also involve certain operational violations (as discussed below in more detail) depending upon parameters of the devices involved and the requirements violated.

Optimizing the arrangement of devices within a chain in abutted relation to minimize both routing and space, while maintaining adherence to the design rules, constraints, and the net list, may require at least one of the devices or several to be transformed. Several exemplary transformations include rotation, mirroring, cascade mirroring, chain cut and mirror, permutation, reordering, suppressing contact metal layers, forming complementary contact metal layers, or the like. In forming an interconnected chain of devices, one or more such transformations may be required to be performed on the devices/chains to ensure that only compatible elements are mated. Additional transformations may be required to ensure that only intended pins or nets are interconnected in conformity with the net list. Such transformations to comply with operational requirements of the circuit design are preferably performed by a suitable mirror engine, permute engine, or the like known in the art. Violations of the operational requirements are determined and the devices or chains are iteratively rearranged (such as by mirroring individual devices or chains along an axis parallel to the abutting interface and recombining) until violations have been resolved.

Conventionally, within an electronic design automation (EDA) tool, if a user was required to insert a chain of devices 200 into a pre-existing chain of devices 300, the user would need to first undo an abutment and break apart the first chain of devices 300. Un-abutting the devices in this manner may require the regeneration of suppressed elements that were shared/suppressed during abutment. The user would then need to allocate space—perhaps by shifting a portion of the devices, move the second chain 200 within the broken first chain 300, position the second chain 200 appropriately, and recombine the first broken chain 300 into combination with the second chain 200. The user would then need to rearrange or transform one or both of the first and second chains 200 and/or 300 to comport with the net list establishing the intended interconnections thereof. Then the user would need to re-abut the chains 200 and 300 and interconnect the composite chain with the remainder of the circuit design. Yet further, the user may have to manually transform one or more devices to suppress formation of the contacts, or remove the diffusion zone of one or more of the devices to thereby share a common drain or source between two adjacent devices disposed in abutted relation. Still further, the user may have to suppress abutment violations and design rule violations according to proximity to force the EDA tool to accept the abutted relation between the at least two devices. This leads to sub-optimal work flow and increased likelihood of mistakes, amongst other deficiencies.

A system formed in accordance with an exemplary embodiment of the present invention herein empowers a user to effect insertion by merely (1) designating one or more devices or chains 200 for insertion; and, (2) designating a position within a pre-existing chain (or chains) 300 for the automatic and proper insertion of the second chain(s) 200 at the designated position within first chain(s) 300 (as seen in FIG. 3). For example, a user may simply click on (or within a certain proximity) of chain 200 and click an intermediate portion (such as the shared contact portion 305) of chain 300. A user may thereby indicate which chain (or chains) to insert and where within the other chain (or chains) it is to be inserted. While FIG. 3 shows an exemplary chain 200 before being inserted within a chain 300, it is to be noted that this invention is not limited to the insertion of just a chain, but also contemplates in various alternate embodiments the insertion of: a device within another chain (or chains), a chain within multiple other chains, multiple chains within a chain, or multiple chains within multiple chains. To effect multiple chain insertions, a user may select multiple chains such as by selecting a first chain and employing a control key (such as shift or ctrl) while selecting subsequent chains or devices. Alternatively, a user may employ features of the user interface to create a bounding box around multiple chains or devices for selection or may rely on features such as "selected plus left" or "selected plus right" (which includes one or more neighbors of the selected item), or the like. In similar manner, the user may select multiple insertion points as well.

Responsive to user designation of a chain and general position indication for its insertion within another chain, a user interface portion 401 in certain embodiments generates interactive feedback to the user referencing the user actions, the designated chain(s), and/or the position within the first chain for insertion. Ultimately, the second chain 200 is inserted into the first chain 300 that complies with the structural requirements and the operational requirements for the circuit design.

To accomplish the insertion—the second chain of devices 200 is automatically moved into overlapping and superimposed relationship with chain 300 according to the position designated by the user (within chain 300). This overlapping superimposed relationship may be plainly invalid for being in violation of at least the structural design rules pre-established for the circuit design, as well as the operational rules such as the net list which specifies the interconnections between devices. The overlapping and superimposed relationship generally involves the placement of two devices where at least a portion of each invades into a portion of another within a three dimensional space.

With the exception of the pre-established abutment rules, such as prescribing a shared drain or shared source, two devices or their elemental regions are not generally allowed to overlap in the same layer of the circuit design. Such overlap would lead to device failure in a majority of instances. Accordingly, overlaps of geometric shapes generally violate structural requirements of the circuit design unless some exception applies (such as, for example, constituent elemental portions of the same device overlapping or an abutment group of devices). Consequently, overlaps of portions of devices generally result in at least structural violations. Operational violations and abutment violations may also be generated depending upon the parameters of the devices, the type of overlap, portions involved in the overlap, and the type of requirements violated, amongst other factors.

Figures 1, 2:
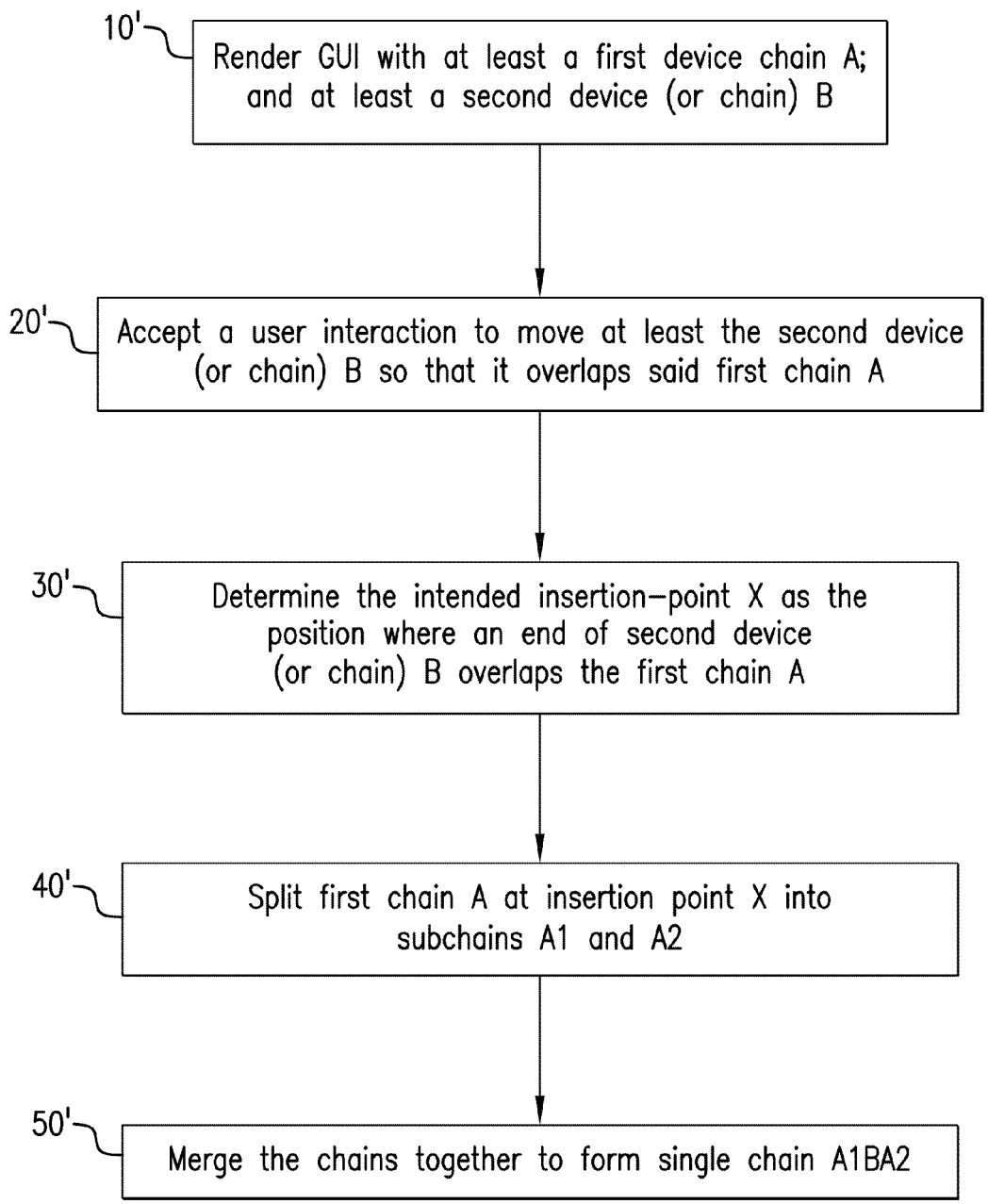
Figure 2:
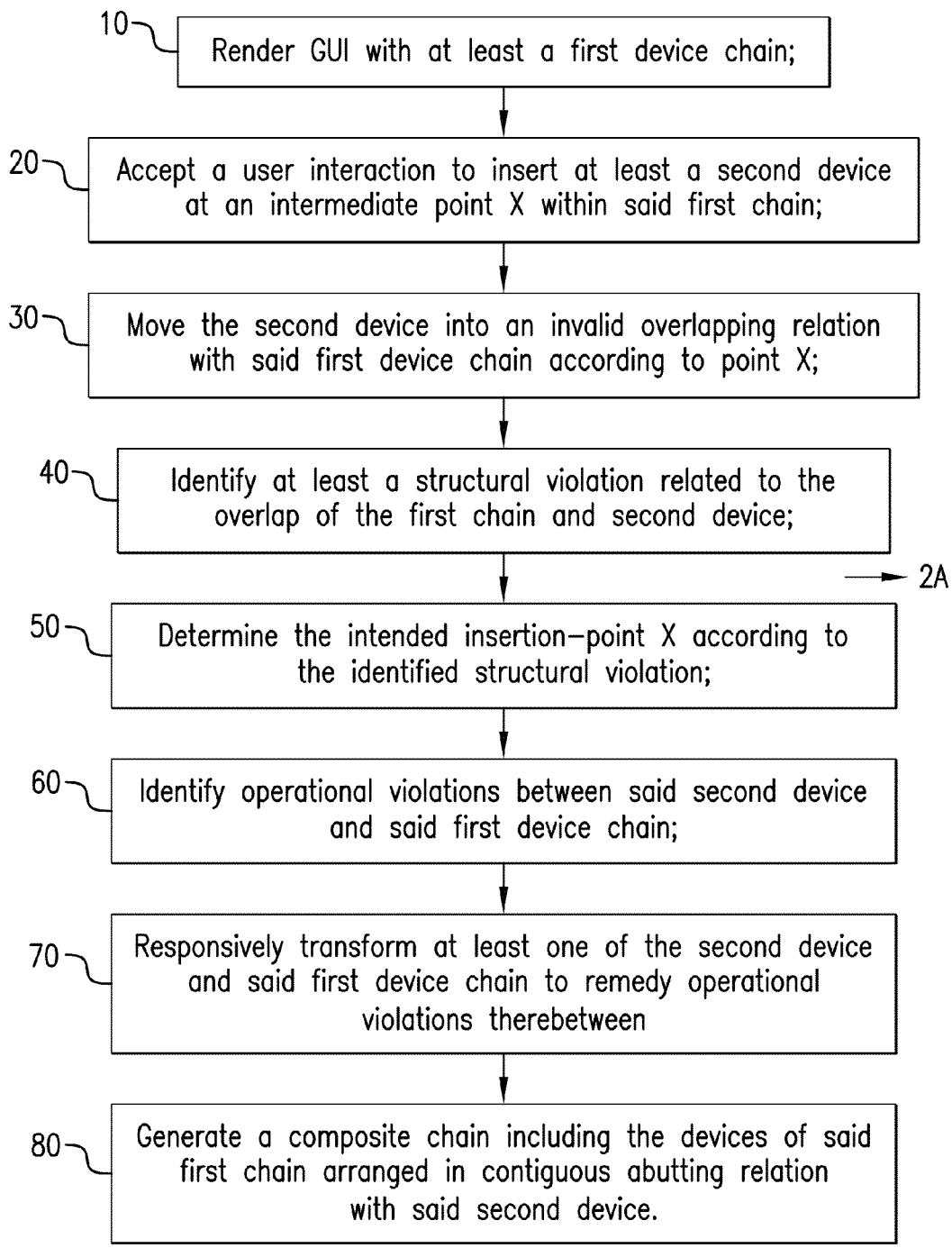

Referring to FIG. 2-1, a general flow of processes is shown for carrying out reconfiguration of a pre-existing device chain by intermediate insertion of a user-specified device or device chain in a system formed in accordance with an exemplary embodiment of the present invention. As shown at block 10', a graphical user interface (GUI) is rendered, which displays for the user a first chain A of interconnected devices from the given circuit design. The GUI also displays for the user at least one second device (or device chain) B to be inserted at some intermediate point in the first device chain A.

At block 20', the GUI accepts a user interaction to move at least the second device (or chain) B so that it visually overlaps the first chain A to generally indicate or designate the desired region where insertion is to occur. The desired region may be defined by any suitable measures but will generally encompass a device or region between devices within the chain A. This desired region is more precisely determined by suitably implemented processing at block 30' as an insertion point X to be the position within the desired region where a selected end of the second device (or chain) B overlaps the first chain A (which end of device/chain B is selected may depend on the particular requirements of the given application). The insertion point X need not necessarily constitute just one discrete 'point' per se, but a zone within the first chain A which may actually constitute multiple points of interconnection between devices in the chain.

In accordance with certain aspects of the present invention, the system affords the user sufficient freedom to generally indicate the region of insert within the first chain A. The system and method then make more precise determination of the actual insertion point X that may support valid insertion in light of the applicable design rules.

The insertion point X may be determined in any suitable manner such as by determining absolute or relative placements of devices relative to user interactions (such as mouse-clicks, hovers, drags, and the like) in connection with the GUI; by identifying overlaps of geometrical shapes representing devices or portions thereof (such as by execution of a connectivity extractor or other such suitable module); by evaluating violations and/or global flags, or by any other suitable measures known in the art.

Such determination of insertion point may be made, for example, in a first system configuration by searching to determine a terminal of a device (in first chain A) proximate to the user indicated region of insert. Any suitable coordinate addressing system for the GUI or the design itself may be used. Proximity to the user's region of insert may be determined in relative manner such as by determining an x, y, and z pixel location of the user's interaction on the screen relative to x, y, and z locations of devices of the first chain A. On the other hand, an absolute location of a user's interaction within the circuit design specified by, for example (x, y) dimensional units and a layer number may also be determined to identify the insertion point.

In other configurations, the insertion point may be determined by moving at least one of: the first chain A or the second device (or chain) B to intersect with the other and then determining the left-most, right-most, top or bottom-most overlap/intersection of a device within the first chain A and the second device (or chain) B. The user may establish in-advance that the insertion point will be where the left-most, right-most, top or bottom-most detected overlap of the second device (or chain) B with the first chain A occurs. Where an overlap detection module such as a connectivity extractor or any other suitable overlap detection measures are employed, the insertion point may be determined by evaluating violations that the connectivity extractor generates responsive to such overlapping devices. Global flags may be suitably set to indicate that there are violations resulting from the user interaction. Then, the left-most, right-most, top or bottom-most violation indexing a device of each of the first chain A and the second device (or chain) B then indicates the insertion point where the first chain A will be broken to accommodate the second device or chain B.

In some configurations, ingress direction may be detected as an indicator, such that the leading edge of the device (or chain) B being dragged (as it is dragged into position in the GUI) shall determine the insertion point between other devices of first chain A. Alternatively, clicking on a particular device (or elemental portion such as a terminal or contact) in the second device (or chain) B to be inserted (such as a left-most, right-most, top or bottom-most device or terminal) may determine the insertion point by identifying where the clicked device (or terminal) of the chain B overlaps with the first chain A.

Once the intended insertion point has been determined, the feasibility of electrical coupling may be evaluated. If the terminal identified belongs to a net different than the terminal to be inserted—then a number of adaptive or transformative remedial measures may be employed. For example, the user's intended insertion point may be overridden and shifted to a next most-proximate terminal for coupling therewith according to the net list, making a best-effort approximation at accommodation of the user's indicated insertion point.

Once the insertion point has been determined, at block 40', chain A is split at the insertion point X into sub-chains A1 and A2. If remedial transformations are required to accommodate the second device (or chain) B, one or more of the devices (or portions thereof) of the sub-chains A1, A2, and the second device (or chain) B may be remedially transformed. Such transformations may, for example, include executing a device/chain mirroring operation, a device/chain rotation operation, a permutation of device pins, or any other suitable permutation to validly accommodate the intended insertion point.

Second device (or chain) B is then electrically intercoupled at block 50' with the two sub-chains A1 and A2 to form a single chain A1BA2.

Figure 4:
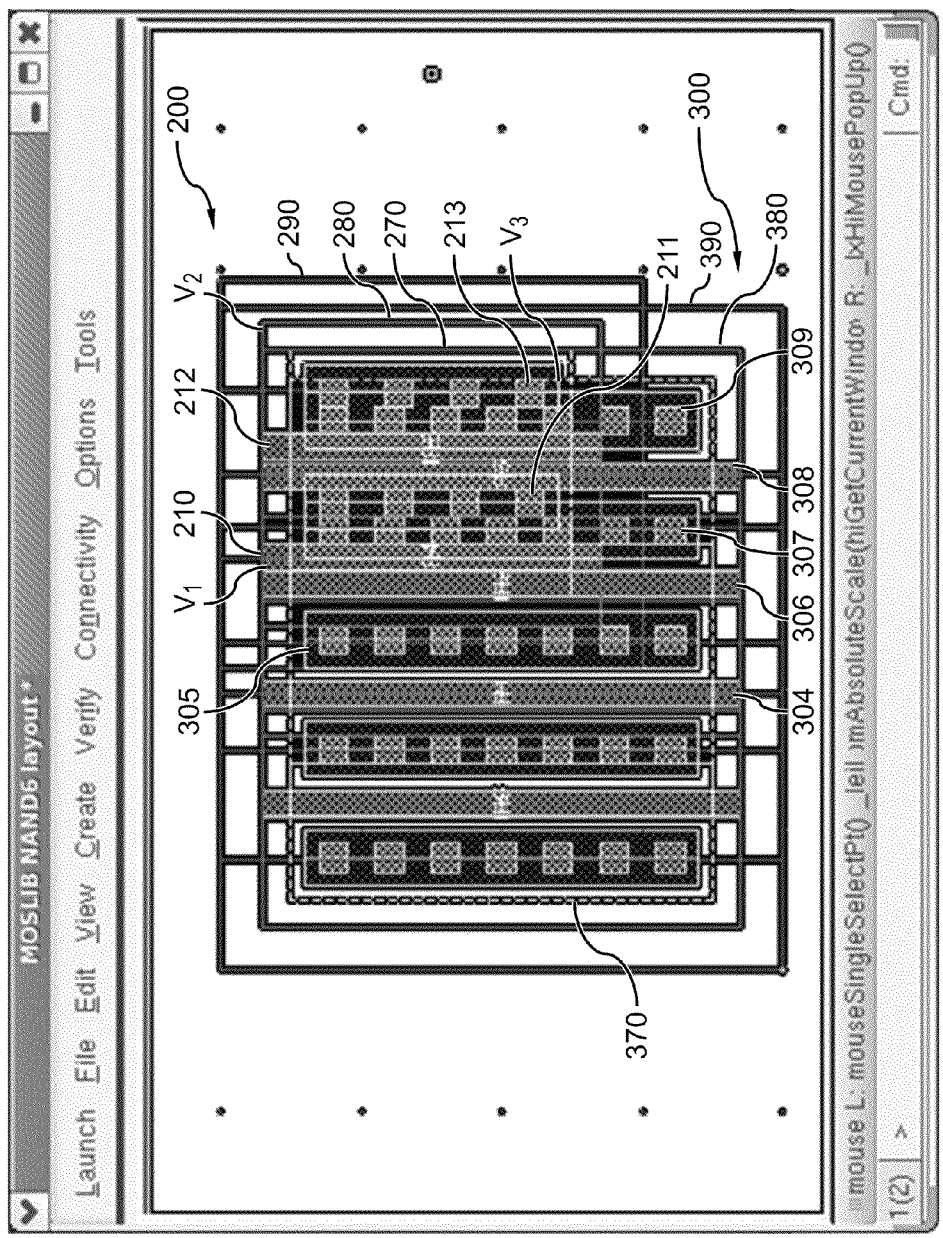
FIG. 4 illustrates a movement operation within a user interface wherein a second chain of devices is brought into an invalid, superimposed and overlapping relation with a first chain of devices.

Turning to FIG. 4, violation processing measures are illustrated for a more detailed exemplary flow illustrating one such measure for determining insertion point and order of devices. It is seen that a second chain 200 has been arranged to overlap a first chain 300. Chain 200 has a number of constituent devices, such as transistors 210 and 212 which respectively overlap with contacts 307 and 309 of the devices of chain 300. Certain functional elements of devices in a circuit design, such as gates, sources, and drains, are not functionally able to co-exist in the exact same location of an ultimately fabricated circuit product—else their respective devices may not function as intended. For this reason, by default, circuit design tools generally indicate an error such as a structural violation or operational violation where such functional devices or their elemental portions are found to overlap in the same layer of the design.

The contact portions 211 and 213 of the chain of devices 200 have been brought into an overlapping and therefore invalid relationship respectively with contacts 307 and 309 of chain of devices 300. Each of these overlapping invalid relations may trigger at least one structural violation (and perhaps operational violations as well, depending upon a number of factors such as device parameters, portions overlapping, net list compliance, and the like). Two devices or constituent elements of devices, do not necessarily need to be in direct overlapping or superimposed relation to trigger violations. The mere placement of two constituent elements within a certain distance of each other without maintaining a pre-established spacing zone therebetween may also trigger a structural violation such as a design rule violation. For example, the continuous adjacency of gate 210 to gate 306 may trigger at least one structural violation even though the two gates are not strictly overlapping. Some devices may even have certain exclusionary zones predefined and graphically illustrated, such as outlined for boxes 290, 280, and 270 to define certain standoff regions (such as for diffusion zones and the like). Other elements or components (or their standoff regions) are not to be disposed within the defined standoff regions. The overlapping of the zones 290, 280, and 270 respectively with the zones 390, 380, and 370 of chain of devices 300 may themselves trigger yet further violations of one or both of the structural and operational requirements pre-established for the circuit design. In such manner, a number of violations are triggered when one chain of devices is overlapped with another. A number of these violations V1, V2, and V3 are illustratively highlighted. Violations preferably contain identification of and references to both the static device and the device which was moved to trigger the violation.

Figure 5:
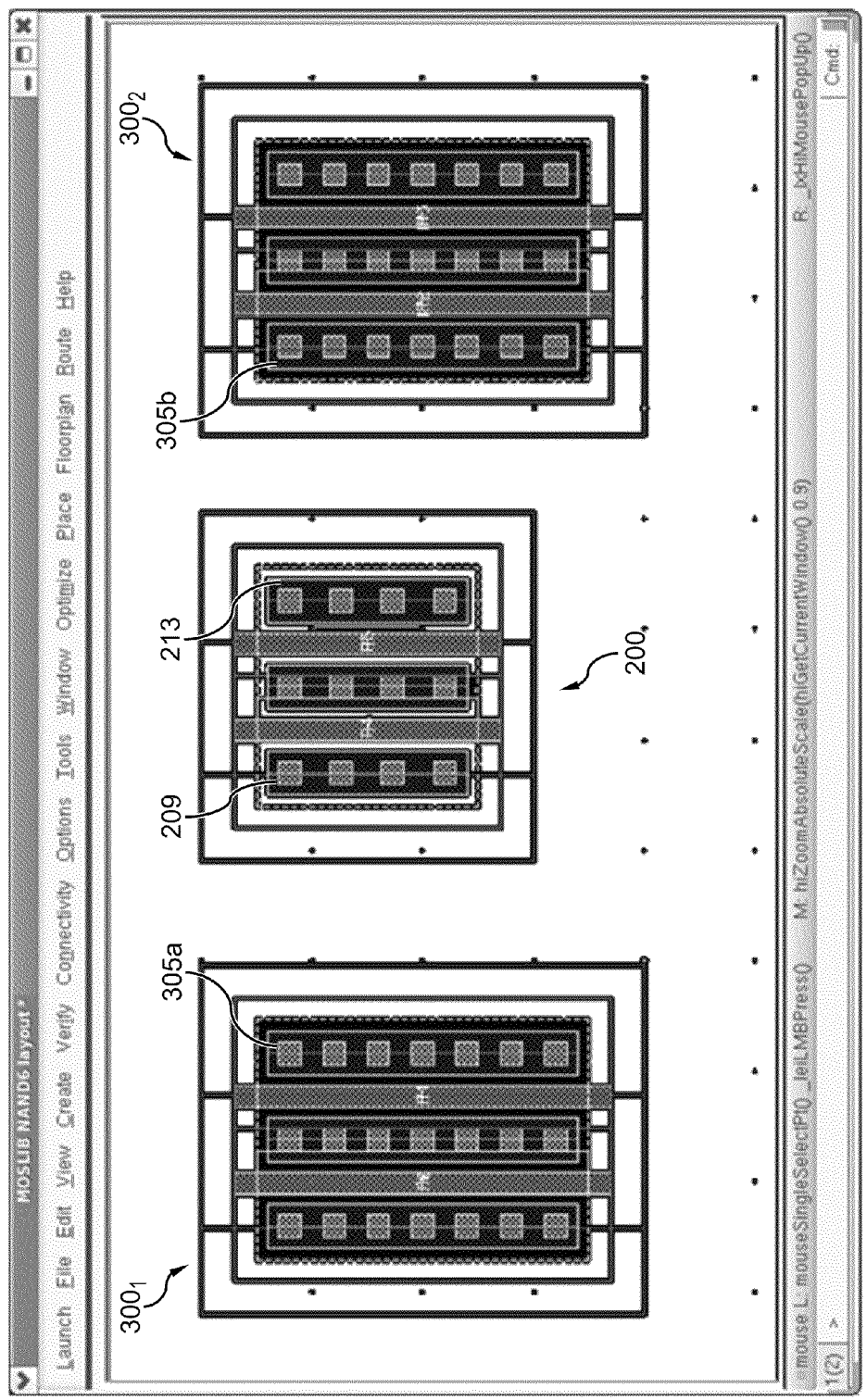
FIG. 5 illustrates an un-abutment operation wherein the first chain of devices are separated, previously-abutting interfaces are recreated, at least a portion of the separated first chain of devices are shifted to allocate space at an intermediate portion of the first chain of devices, and the second chain of devices is moved into the allocated space.

Responsive to the identified violations of the overlapping chains of devices 200 and 300, the first chain 300 may be broken into a plurality of sub-chains according to the designated insertion point(s). For example, as illustrated in FIG. 5, chain 300 may be broken into sub-chain $300_1$ and sub-chain $300_2$ to accommodate insertion within the chain 200. If plural moving chains n are being inserted into a single static chain at plural insertion points n, the first chain may be broken at each of the insertion points into n+1 sub-chains. In some configurations, each chain may be decomposed into constituent devices and recomposed one device at a time through sequential movements and abutments. In certain other configurations, the original chains are replaced by a composite chain that is generated anew, such step of breaking apart chain 300 and moving chain 200 between the resulting segments of chain 300 may be optionally omitted. In such exemplary configurations, the violations are assessed to determine a device order, then an ordered list of devices from both the first and second chain are presented to a chaining API/engine which generates a composite chain including the ordered list of devices to replace both the first and second chains 200 and 300.

For clarity and comprehensiveness of disclosure, FIG. 5 illustratively shows an insertion process involving breaking apart a static chain into sub-chains and inserting a moving chain therein. Accordingly, chain 300 is broken into sub-chain $300_1$ and sub-chain $300_2$. The shared drain/source interface portion 305 (seen in FIG. 4) is broken and one or both of the devices 304 and 306 are automatically transformed to either: 1) create or modify separate source/drain and contact interface portions 305a and 305b; or 2) remove the suppression of one or both of the interface portions 305a and 305b (and other such portions which were previously suppressed when shared portion 305 commonly served a single chain of devices 300).

Referring back to FIG. 3 for clarity, only one shared interface portion 305 (which may be a source or a drain, and may have metal contact portions above it) is graphically rendered between transistor gates 304 and 306 in the abutted chain illustrated. However, when this chain 300 is broken into two sub-chains $300_1$ and $300_2$, the corresponding devices 304 and 306 would be inoperative without their own respective elemental portions such as contacts, drains, sources, and the like. Consequently, upon separation of the chain, the separated devices 304 and 306 should be transformed to ensure that each has its own constituent elements necessary for proper operation. In this regard, shared interface region 305 is broken and re-created separately to provide each of devices 304 and 306 with independent interface regions 305a and 306b.

Chain 200 is then suitably merged in abutted relation with both sub-chain $300_1$ and $300_2$ on respective right and left portions $305_a$ and $305_b$ thereof. When this is performed, the interfacing source or drain portions 209 and 213 will be respectively combined in abutted relation with partner source or drain interface portions $305_a$ and $305_b$. During this abutted combination, one or both of the portions 213 and $305_b$ on the one hand and portions $305_a$ and 209 on the other hand, will be combined with their respective partners for a shared source or drain, as the case may be according to the predefined interface nets in the net list.

Thus, according to the net list, one or both of chain 200 and sub-chain $300_1$ or $300_2$ may need to be transformed in whole or in part such as being mirrored or reordered such that the shared contacts, drain, or source portions $305_a$ and 209 and 213 and $305_b$ are electrically compatible according to the net list of intended circuit interconnections (and any other applicable structural or operational rules/constraints). A number of other transformations or permutations may be carried out this way in certain embodiments and particular applications of the present invention, but are not further described to preserve clarity and brevity.

Figure 6:
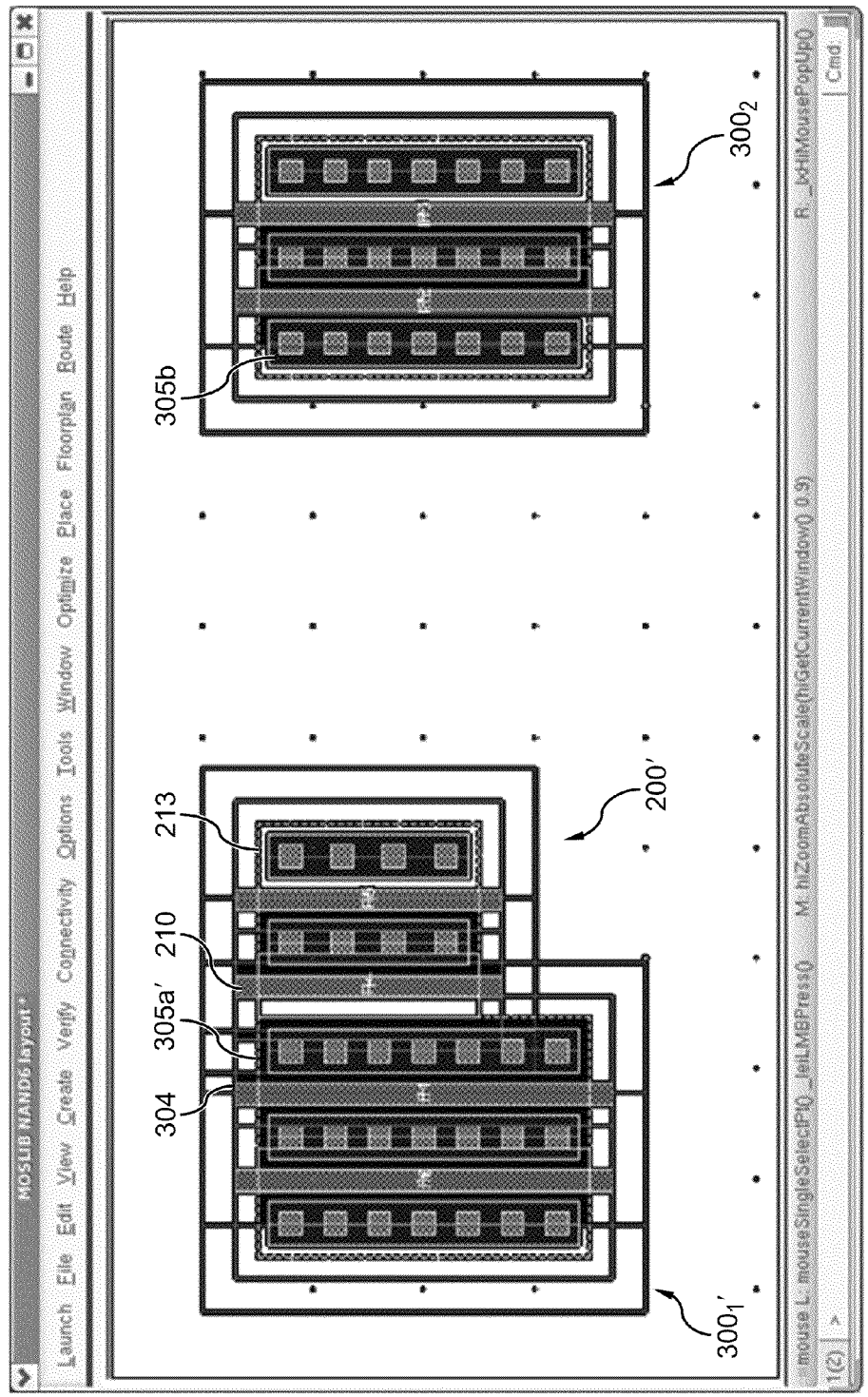
FIG. 6 illustrates an abutment operation where the second chain of devices is abutted with a separated portion of the first chain of devices.

As seen in FIG. 6, chain 200 has been transformed into a chain 200' and combined in abutted relation with transformed sub-chain $300_1$'. Following the transformations, the device portion $305_a$' is now a common source or drain interface portion with portion 209' (as the case may be) and shared between gates 304 and 210 of their respective devices. In making the transformations, one or both of interface portions 209 and $305_a$ were omitted, suppressed, mated in complementary fashion, or combined. Device chain 200' is thereby combined in abutted relation with sub chain $300_1$'. Further transformations may be necessary for the combination of sub chain $300_2$ with chain 200'. To accomplish the combination, the interface portion 213 may be transformed and the portion $305_b$ may be transformed as well to be combined in abutting relation to thereby generate a composite chain including the devices of the original chain 200 and original chain 300. The resulting arrangement will be in conformity with both the structural design rules for the circuit design and the operational electrical connections pre-established between contacts of specified devices therein.

Figure 7:
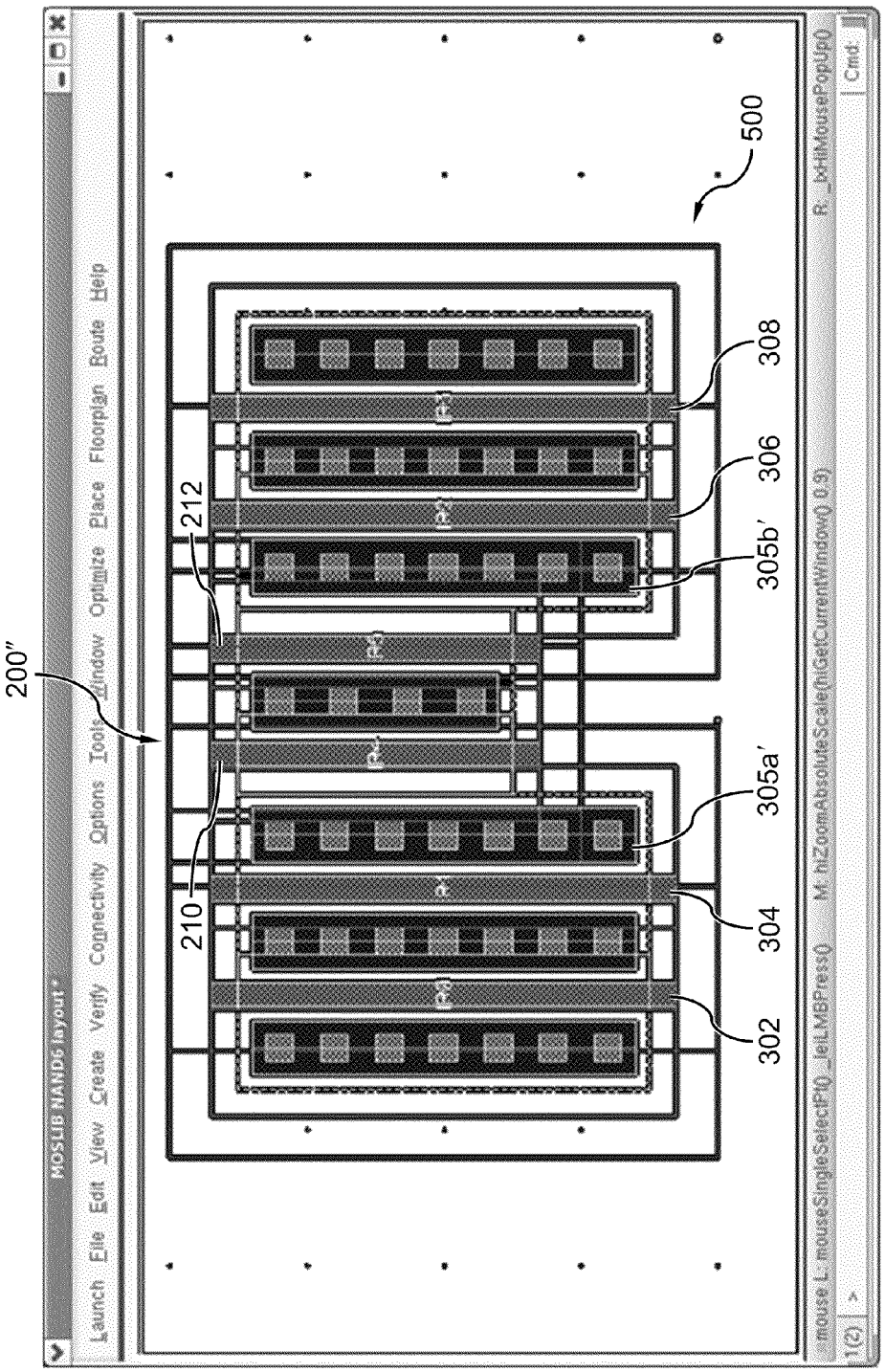
FIG. 7 illustrates an abutment operation where the second chain of devices is inserted in abutted relation within an intermediate portion of the first chain of devices; and, FIG. 8 is a flow diagram illustrating a flow of violation processing measures to determine insertion point and device order in accordance with an exemplary embodiment of the present invention.

FIG. 7 illustrates a successive sequential snapshot along the process of combining the devices of chain 200 with devices of chain 300 into one chain in abutted relation in accord with both the structural and operational rules of the circuit design. FIG. 7 shows the second chain 200" having been transformed at least twice in that its two extreme edge interface portions 209' and 213' were each transformed to enable combination in abutted relation respectively with the interface portions $305_a'$ and $305_b'$ of sub-chains $300_1'$ and $300_2'$ to form the composite chain 500. The gates of devices 210 and 212 remain unchanged along with the gates of devices 302, 304, 306, and 308 of the first chain 300 of devices. However, it is seen that the shared interface portions $305_a'$ and $305_b'$ have now been transformed to serve as a common interface portion for each of the separate devices on either side thereof, such as gate 304 and 210 on the one hand, and gates 212 and 306 on the other hand.

FIG. 2 illustrates an exemplary flow of processes for effecting the transformative combination of chains described above in accordance with one embodiment of the present invention. In this particular embodiment, insertion position X is automatically determined making convenient use of information that may be readily available as a result of other processing carried out in the given EDA tool, namely a connectivity extractor, or other suitable measures for determining device overlap and other structural or operational violations. In this example, the given chain of devices are interconnected by one or more abutments, and abutment violations in particular are employed to . . . .

At block 10, the graphical user interface 400 (as seen in FIG. 3) of a given EDA tool such as a circuit layout editor is rendered to include at least a first device chain 300 pre-established and interconnected within the circuit design (generally referred to as the static chain). At block 20, the user interface accepts a user's interactive instructions to insert at least a second device (referred to as moving chain) at an intermediate position X within the first chain of devices. A user may effect such insertion by selecting, for example, the second device (such as by clicking in its proximity or any other suitable interaction to designate a device), and may specify the insertion position X (such as by clicking the mouse again) at a certain position within the first chain of devices pre-established in the circuit design and rendered in the user interface. Alternatively, a user may effect a click-and-drag operation, with a user interface such as a mouse by clicking on the second device and dragging to an intermediate position of the first chain 300 and only then releasing an interface button.

During such user interaction, dynamic graphical feedback may be provided to the user which may indicate for example, the structural and/or operational propriety of effecting the insertion at the instantaneous location of the user's pointing interface.

At block 30, the second device is automatically moved into an invalid overlapping superimposed relation with the first chain of devices according to the position X specified by the user (as seen in FIG. 4). For example, if the user clicked on the second device and then clicked next to a transistor 304 within the first chain, the second device is automatically moved into a superimposed overlapping relationship with the designated transistor 304 in the first chain. The tool may be configured to align the insertion to the closest valid position between devices to the right, left, above, or below of the position X for insertion of the second device.

At block 40, at least a structural violation such as an abutment violation or design rule constraint violation is automatically triggered and identified as being related to the overlap of both the first chain of devices and the second device responsive to the user's interaction and movement. In a preferred embodiment, the operational violation detection and remediation detailed at block 60 are performed before the structural violation-handling measures of block 40. The structural violation is determined by overlap of devices (or portions thereof), their set-back regions, or intrusion of one device into a set-back region of another device. The circuit design is preferably polled by the EDA tool manually, periodically, and responsive to movement operations to determine the existence of violations. When the placement of a device is seen to violate the predefined design rule constraints, the EDA tool preferably triggers violation reporting and handling measures such as a global flag (for example: "insertChain": {yes, no} or "insertChainAbutViolation": {first, last}), passage of violation objects to handler functions, or the like which identify the specific design rules violated, the devices involved, the action leading to the violation, and other pertinent details to create a record of the violations—preferably in a suitable data object for recovery and subsequent processing. At least a portion of the data collected is preferably reported to the user. Each violation preferably also indicates which device was static and which was moved to trigger the violation, direction of movement, and the like, amongst other information. Generally, the EDA tool has a number of handler processes which may be automatically invoked responsive to the violation or flag. For example, operational violations such as shorts may be handled by a predetermined execution sequence of mirror engine, permute engine, or other suitable engines to responsively remedy shorts between device portions according to the net list.

At block 50, the user's intended insertion position X is identified according to the structural violations due to the overlapping devices, such as the violations V1-V3 discussed above in regard to FIG. 4. In a preferred embodiment, a violation map is generated correlating the identified violations with positions along the first chain of devices in the circuit design. The orientation of the first chain of devices such as horizontal or vertical is determined. Such orientation determination may be made by identifying a position of a first device and a position of a second device within the chain to determine their relative geometric placement (e.g. horizontally arranged). Such identifications may be made by querying the given circuit design or its devices for coordinate positions or abutment directions, such as by employing suitable APIs to access objects which may preferably be stored in an OpenAccess Database (OADB) or any other suitable data storage and retrieval form. A survey of the violation map to identify an extreme violation position along the first chain such as a left-most, right-most, upper-most, or lower-most violation (according to a user configured setting such as insert left, right, top, bottom, or the like) is preferably performed. Accordingly, if the first chain of devices is determined to be, for example: horizontal and the left-most violation is identified in the violation map to be between devices 304 and 306, the user's intended insertion position X may be discerned as interface portion 305. An ordered list of devices is then created concatenating or appending the devices to the left of the insertion point, the second device for insertion, and the devices to the right of the insertion point. A more detailed explanation of the determination of the intended insertion point according to the violations will be had with regard to FIGS. 2A and 8 below.

At block 60, in certain configurations, operational violations amongst the intended combined devices in the ordered list may optionally be determined based upon at least pre-established interconnections defined in the net list of the circuit design. Such determinations may be performed within a chaining API/engine, a mirror engine, a permute engine, or the like where both operational violation detections and transformations are performed. In a preferred configuration, the operational violations are detected and remedied before the structural or abutment violations are identified. Abutment then proceeds after operational violations such as short violations have been remedied by appropriate transformation.

For example, if a terminal 1 is now effectively connected or shorted to a terminal 2 after the movement operation, whereas the net list specifies that terminal 1 is to be connected to another terminal 1, an operational violation such as an electrical or short violation may be triggered. Another exemplary operational violation may be seen where a ground terminal is coupled to a 5 volt terminal or two disparate interface portions are to be combined in abutted relation. Triggered operational violations generally require a transformation of one or more devices to accomplish abutted combination. At block 70, the optimization process, mirror engine, permute engine, or the like may be further employed to suitably transform, reorder, or rearrange one or more devices in the ordered list to remedy the operational violations.

At block 80, a composite chain 500 (as seen in FIG. 7) is generated to include the devices of the first chain arranged in contiguous abutting relation with the second chain according to the ordered list and in compliance with the structural and operational requirements of the circuit design. If the transformations required decoupling one or more devices from the remainder of the circuit design, the composite chain is then recoupled to the remainder of the circuit design preferably according to a placement and auto-routing process.

Figure 2A:
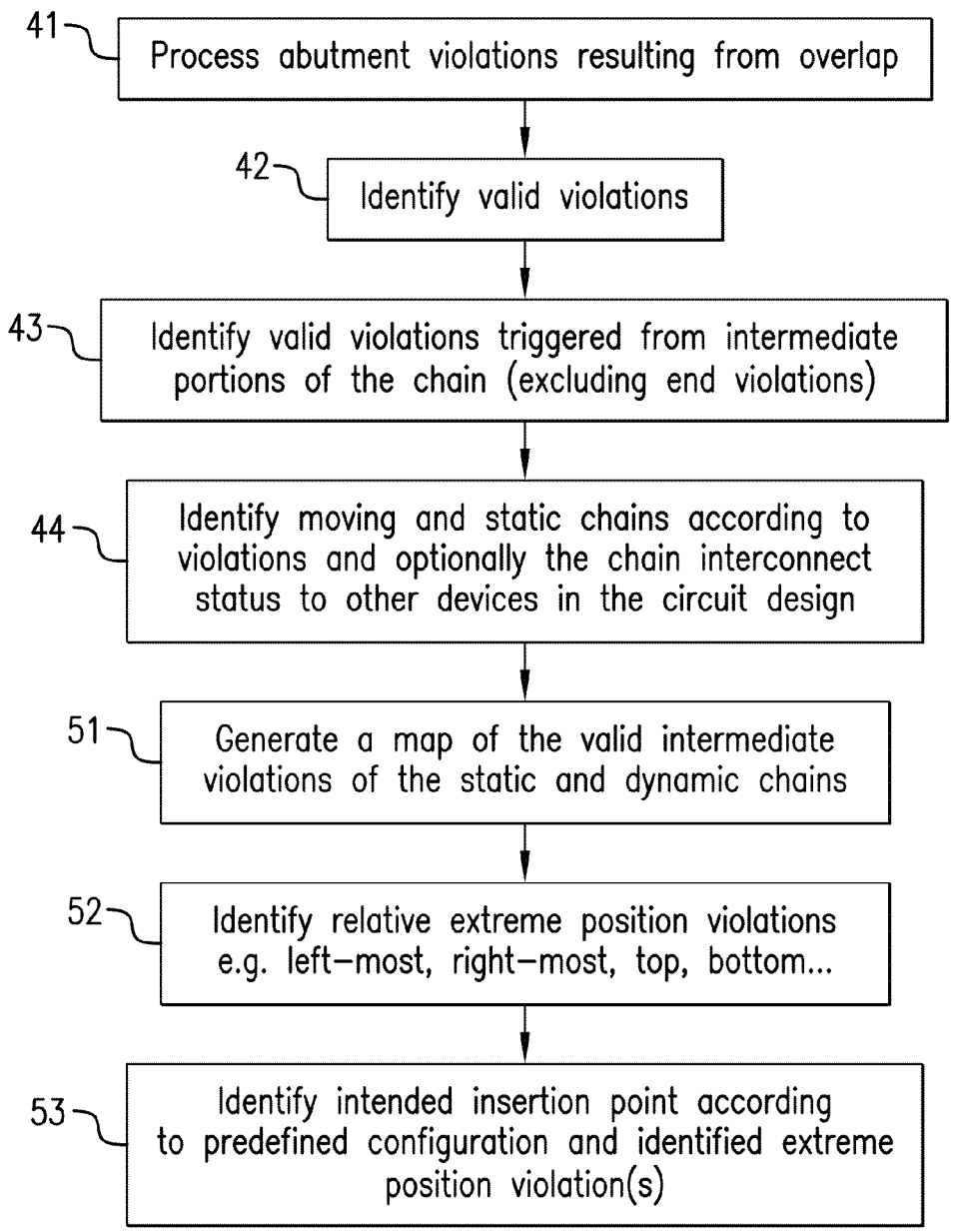
FIG. 2A is a more detailed exemplary flow diagram detailing blocks 40 and 50 of the embodiment illustrated in FIG. 2.

As seen in FIG. 2A abutment violations resulting from the overlap are collected at block 41. An abutment violation is primarily a structural violation due to an overlap of shapes, devices, or terminals within a circuit design but may also include some operational violations. Abutment violations are related to overlapping device instances in a design. At block 42, valid abutment violations are identified. Valid abutment violations include violations between two or more device instances which are suitably reconcilable by establishing an abutment between the devices. A valid abutment violation references overlapping portions of device instances which are both pre-established to have certain device properties and are sufficiently compatible for permissible abutment with one another in the particular application intended. What abutments are permissible in this regard, hence denote those abutment violations which may be 'validly' resolved, and are preferably predefined in any suitable manner known in the art for a given application. For example, compatibility of device portions may be determined based on their having the same abutment class (having predefined set(s) of properties), or deriving from the same master template, having correct abutment directions, and the like. This is discussed in more detail below with reference to FIG. 8.

At block 43, violations triggered at mutually opposing ends of the moving and static chain(s) are excluded as they may be suitably addressed with standard abutment processing. End violations may be identified by determining the orientation of each chain, and iterating through each violation thereof to determine (for example) a left-most, right-most, top-most, or bottom-most violation (depending upon the orientation) for each chain. Where a violation involving two opposing end portions respectively of two different chains (moving and static) is identified to be in the same position of the circuit design, this may be identified to be a non-intermediate concatenation of devices and the moving chain may simply be appended to the end or beginning of the static chain. If not already determined, at block 44, the moving and static chains are identified by the violations which identify the moving device/s which triggered the violation. Alternatively, the static device may be determined based upon a pre-existing interconnection to the remainder of the circuit design.

As discussed above, abutment violations contain references to the static and moving devices which triggered the violation and their abutment directions. When devices abut they create an abut-group (for example "Abut_|N1_|N2") which contains the static and moving devices involved in the abutment. At block 51, a map is generated by iterating through the static devices in the abutment violations (such as by queries to an OpenAccess database for the design, referencing an extrinsic violation list, or the like) to traverse across the static chain abut-groups. This enables identification of each of the devices and their relative placement in the static chain(s). Repeating this traversal process with the moving devices in the abutment violations enables identification of each of the devices and their relative placement in the moving chain(s).

All of the moving chains are iterated through for each static chain to build a map of one or more insertion points. Optionally, an insertion point is based on the first or last-most violation in an ordered violation list. At block 52, the first or last-most violation is identified as having no respective preceding or succeeding violations. At block 53, each static chain device is then iterated through to identify an entry in the violation map. If no entry is found, the static device is added to the new ordered list. If an entry is found, the moving chain is located using the moving device defined in the violation map entry. Depending upon the abut access directions (direction, e.g., up, down, left, right) the instant static device is added to the ordered list and then all devices in the moving chain are added. Alternatively, all the moving chain devices are added to the new ordered list, then the static device is added. This process is repeated until all static and moving chain devices have been added to the new ordered device list. Once the order is determined according to the above description, the ordered list is preferably passed to the chaining engine/API to effectively insert the moving chain within the static chain (such as by moving a first device to a position in the design and abutting a second device, thereto . . . repeated until the n$^{th}$ device has been abutted. Alternatively, the new composite chain may, in some configurations, be regenerated to include the devices of the moving and static chains with removal of both the first and second chains 200 and 300.

Figure 8:
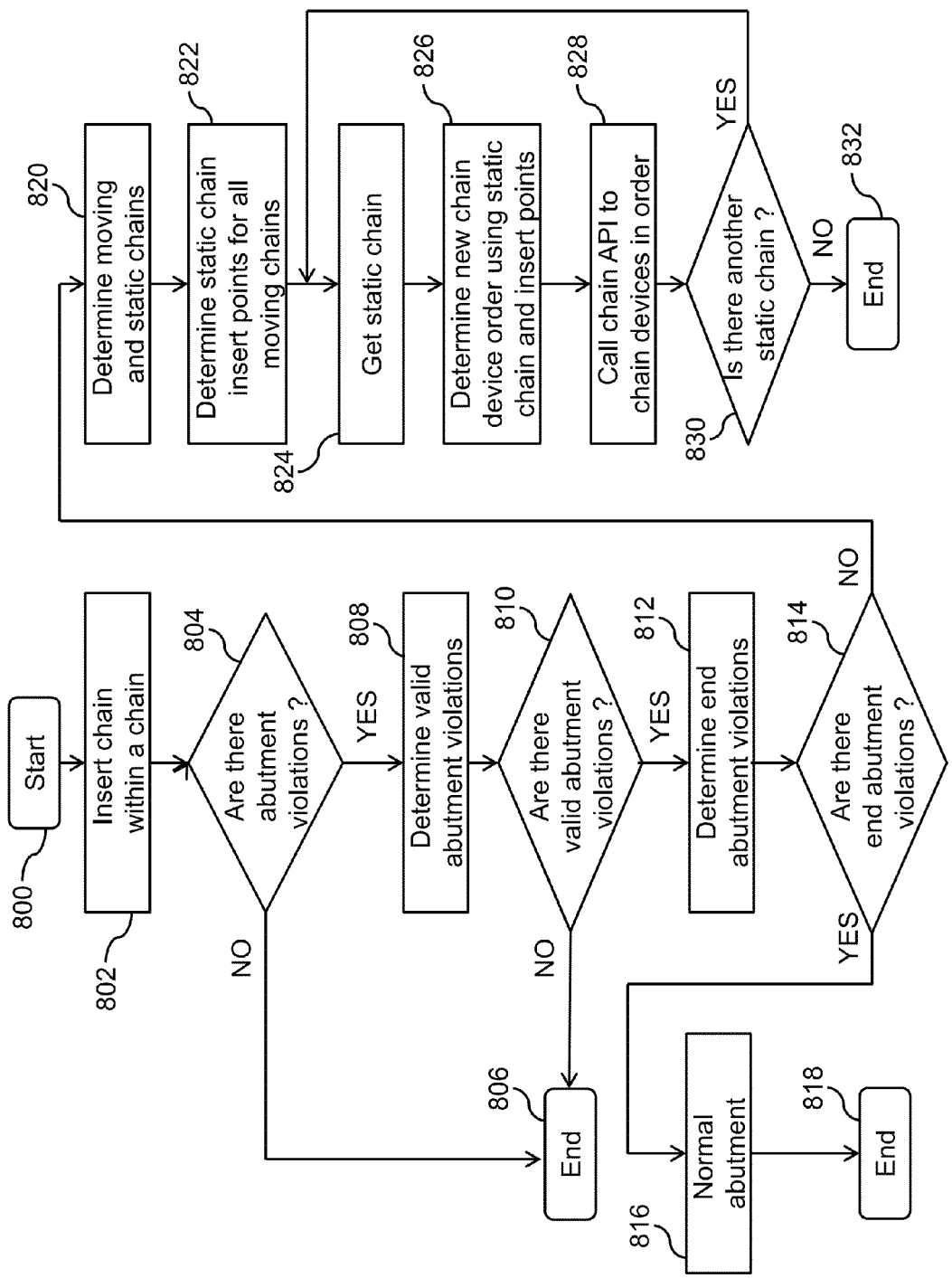

As seen in FIG. 8, a more detailed flow of processes for determining an insertion point and device order according to triggered violations in the combining of a device with another chain of devices is illustrated. At block 800, the process is initiated responsive to a user instruction to insert at least one device of a second chain of devices (referred to as "moving chain") into a pre-existing first chain of devices (referred to as "static chain"). Flow proceeds to block 802 where the second chain of devices is moved to be overlapping with the first pre-existing chain of devices for insertion within the pre-existing (or static) chain.

Flow proceeds to decision block 804 where structural violations such as abutment violations between the devices in the combined chains are identified. Where it is determined that no abutment violations exist, flow proceeds to block 806 and the method is complete, as there are no abutment violations to be resolved.

On the other hand, if abutment violations have been determined within the design, then flow proceeds to block 808 to determine if the abutment violations are valid. As described in preceding paragraphs, valid abutment violations are taken to be those abutment violations which are reconcilable or correctable by abutting the two violating devices. Such devices are preferably abutted by creating an abut group that identifies each of the abutting devices. An abut group may be a data structure, object, or the like which identifies each of the device instances. Alternatively the abut group may be indicated by corresponding properties or attributes within each of the constituent device instances of the abut group.

Compatibility and/or likeness in a number of suitable device properties may be required for two devices to be properly abutable—otherwise, they must be maintained as separate devices without overlap therebetween. Abutment violations between two terminals (or metal portions) are evaluated to determine if the pair of the moving and static device are parametrically incompatible with abutment according to pre-established design or device rules. If they are incompatible with abutment, then flow proceeds to block 806 and terminates. The user may then take remedial action (such as by editing the parameters or functions of one or both devices) to accommodate abutment and re-attempt the insertion.

Generally, though there may be exceptions depending upon implementation, for two devices to be properly abutable they should be of the same class or type of device (such as, for example: NMOS or PMOS); or be device instances of the same master/parent template (a master/parent template may be employed in hierarchical circuit design to create device instances having essentially the same properties); they should have pins defined on the same (or equivalent layers of the circuit design); they should be connected to the same net; they should overlap; they should have complementary abutment direction properties set (for instance one device may allow abutment from the right and the other device for abutment should allow abutment from the left)—or one should be rotatable (such as 180 degrees) or be permutable to switch terminal relations; if one device instance is in any type of group, the other device instance should be in the same group; and the like. Additionally, each device should have an abutment function (written for example in SKILL or any other suitable language) which defines how the particular device is brought into abutting relation with another. Such abutment function allows a designer to change certain characteristics of the abutment which will result between the particular devices.

If appropriate portions (such as source or drain terminals) of two devices configured with the above-described compatible properties overlap, then they will trigger a valid abutment violation until an abut-group is created to signify their abutment in accordance with the structural and operational rules of the circuit design. Once such an abut-group has been created, the abutment violation is taken to be resolved. Such requirements and parameters may well vary from case to case depending upon the specific implementation.

Flow then proceeds to decision block 810 where it is evaluated whether valid abutment violations are indeed present for further processing. If no valid abutment violations are present, then flow proceeds to block 806 for termination of the process as there are no valid abutment violations to base abutment on. On the other hand, if valid abutment violations are found, then flow proceeds to block 812 to identify any end abutment violations.

End abutment violations occur between the devices at mutually opposing ends of the static and moving chains (for example, a violation situated at the overlap of the right edge of the moving chain AND the left edge of the static chain where the abut direction is from left to right). As another example, an end abutment violation may occur at the overlap of the left edge of the moving chain AND the right edge of the static chain when the abut direction is from right to left. In a vertical abutment, an end abutment violation may occur where one chain is moved above or below another for end to end abutment.

Where an end violation is found, the user presumably did not intend insertion into an intermediate position within the static chain but instead intended to append the moving chain to the end or beginning of the static chain in end-to-end relation. End violations do not generally require special insertion processing, intermediate transformations or reconfigurations. Accordingly, they are preferably passed to the abutment measures at block 816 for append processing. Thereafter, flow proceeds to block 818 and ends.

On the other hand, if the violations are deemed to be other than mere end abutment violations, then flow proceeds to block 820 to determine the moving and static chains. The static chains are pre-established within the circuit design and intercoupled to at least one other device while the moving chain is the chain designated for insertion into the static chain (as discussed above). Static chains may be determined by evaluating their interconnection to other portions of the circuit design such as by querying interconnection status of member devices, or more preferably, by evaluation of the violations themselves. Violations preferably indicate the non-moving (i.e. static) device(s), device(s) moved, and the direction moved (for example, from right to left) immediately prior to the violation being triggered. An evaluation of the violations reveals the identities of devices in both the static and moving chains.

Flow then proceeds to block 822 (discussed above with relation to FIG. 2A) to determine the static chain insertion point for the moving chain(s). The location within the static chain (or first chain) position X is determined for insertion of the devices of the moving chain (or second chain) into the static first chain. As discussed above, a map is generated to correlate violations with positions along the static first chain to signify insertion points in each static first chain for all moving chains. The insertion point is preferably determined as a point between two devices in the static first chain which overlaps with a predetermined end of each moving chain (such as right or left end). Preferably the map is stored in a map type data object/structure defined in the C++ standard library (which serves as a container for key-value pairs), but may be stored in any other suitable data object or structure such as an array of pointers to device identifications (IDs) or memory locations, a linked list, a database, or the like. Where the map is stored as a C++ standard map container, the map is preferably keyed on the database identification (ID) of the static chain instance and the value stored is preferably a construct containing data retrieved from the abutment violation(s) such as reference identification, pin figure identification, abut class, abut direction, and the like. While an exemplary C++ implementation has been described above, any suitable language, data structure, or objects may be employed herein. While violation processing has been described as a preferred embodiment, such mapping and ordering of devices may be effected by other measures such as by determining coordinates (e.g. x, y, z) of user-interface interactions such as the clicking to designate a chain or chains and a subsequent lookup of the device or devices at the coordinate of the interaction. In similar manner, the intended insertion point X may be determined by evaluating the coordinates of the user interaction in placing a chain for insertion. Certain suitable calls or queries to a data store holding the circuit design such as getDevice(x,y,z) may return the most proximate device to an interaction coordinate. Certain other suitable calls or queries such as getNeighbor(deviceX) may be employed to determine neighboring devices or devices commonly coupled to a certain net, device, or terminal. Still further, the insertion point may be determined by finding the left or right end instance in the moving chain, and then finding the instance in the fixed chain which overlaps the end instance of the moving chain with suitable queries or function calls. For example, overlap queries, calculation APIs, or connectivity extractors may be employed instead of or in combination with traversing violations. Any other suitable measures to determine device order, intended insertion point, neighboring devices, and the like may be employed.

Flow then proceeds to block 824 where the static first chain is retrieved by retrieving an ordered list of database instance identifications of the devices thereof, such as by querying the design data store (which may be an OpenAccess database or the like) for manipulations to be performed thereon.

Flow then proceeds to block 826 where the new chain device order is determined based on the identified static first chain and the identified position X intended insertion point. The insertion point contains the static and moving instances (devices of the first and second chains respectively). The device order for each new chain is determined using the moving and static chains and the insertion points. For each static chain, the device instances (for example: 302, 304, 306, 308 as seen in FIG. 3) are traversed to identify an entry in the insert point map. If no entry is found, the static instance is added to the new chain. If an entry is found, the abut access directions are used to determine if the moving instance or static instance is to be first. If the moving instance is to be first, then all the device instances in the moving chain are added to the new chain and then the remaining static instances are added. If the static instance is first, then the static instance is added to the new chain, then all the instances of the moving chain are added. The remaining static instances are added thereafter. The insert point map processing is iterated until all of the static chain entries have been added to the new chain.

The chaining API/engine of the EDA tool may then be employed to transform and combine the devices of the first chain and the second chain at the intended insertion point X at block 828. Flow then proceeds to block 830 where it is determined whether there is another static chain (or chains) to be incorporated. If yes, flow proceeds back to block 824, to iterate back through the loop of blocks 824-830. On the other hand, if the decision is no, flow proceeds to the end block 832.

In various embodiments of the invention, the system may be implemented in the form of software modules or hardware modules. In an exemplary embodiment of the invention, the system is implemented as part of an Electronic Design Automation (EDA) software suite or may be implemented in any suitable circuit design tool.

FIG. 1 illustrates a block diagram of a computer system for executing such EDA in accordance with various embodiments of the present invention. A computer system 100 contains a processor unit 102, a main memory 104, an interconnect bus 106, a mass storage device 108, peripheral device(s) 110, input control device(s) 112, portable storage medium drive(s) 114, a graphics subsystem 116, and an output display 118. Processor unit 102 may include a single microprocessor or a plurality of microprocessors for configuring computer system 100 as a multi-processor system. Main memory 104 stores, in part, instructions and data to be executed by processor unit 102. Main memory 104 preferably includes banks of dynamic random access memory (DRAM) as well as high-speed cache memory.

For the purpose of simplicity, all the components of computer system 100 are connected via interconnect bus 106. However, computer system 100 may be connected through one or more data transport means. For example, processor unit 102 and main memory 104 may be connected via a local microprocessor bus; and mass storage device 108, peripheral device(s) 110, portable storage medium drive(s) 114, and graphics subsystem 116 may be connected via one or more input/output (I/O) buses. Mass storage device 108, which may be implemented with a magnetic disk drive, an optical disk drive, a solid state device, or an attachment to network storage, is a non-volatile storage device for storing data and instructions, to be used by processor unit 102. In the software embodiment, mass storage device 108 may store the software to load it to the main memory 104.

Portable storage medium drive 114 operates in conjunction with a portable non-volatile storage medium, such as a floppy disk, a compact disc read only memory (CD-ROM), or a digital versatile disc read only memory (DVD-ROM), to input and output data and code to and from the computer system 100. In one embodiment, the software is stored on such a portable medium, and is input to computer system 100 via portable storage medium drive 114. Peripheral device(s) 110 may include any type of computer support device such as an input/output (I/O) interface, to add additional functionality to computer system 100. For example, peripheral device(s) 110 may include a network interface card, to interface computer system 100 to a network.

Input control device(s) 112 provide a portion of the user interface for a computer system 100 user. Input control device(s) 112 may include an alphanumeric keypad for inputting alphanumeric and other key information; and a cursor control device such as a mouse, a trackpad or stylus; or cursor direction keys.

In order to display textual and graphical information, computer system 100 contains graphics subsystem 114 and output display(s) 118. Output display 118 may include a cathode ray tube (CRT) display, liquid crystal display (LCD), plasma, or active matrix organic light emitting diode (AMOLED) display. Graphics subsystem 116 receives textual and graphical information, and processes the information for output to display 118.

In a software implementation, the EDA software includes a plurality of computer executable instructions, to be implemented on a computer system. Prior to loading in a computer system, the EDA software may reside as encoded information on a computer-readable tangible medium such as a magnetic floppy disk, a magnetic tape, CD-ROM, DVD-ROM, flash memory, or any other suitable computer readable medium.

In a hardware implementation, the invention may comprise a dedicated processor executing processor instructions for performing the functions described herein. Suitable circuits may also be developed to perform these functions.

Thereby, a user with minimal interactions with the user interface of an EDA tool such as a circuit layout editor may automatically insert a second chain including at least one device into a pre-existing first chain of abutted devices in compliance with both structural and operational requirements of the circuit design.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of circuit design and implementation flows or processing steps may be reversed or interposed, all without departing from the spirit or scope of the invention as defined in the appended claims.

What is claimed is:

1. A method for automatically reconfiguring a chain of interconnected devices established in a circuit design according to a set of predefined design requirements, the method comprising:
   executing a computer processor to graphically render on a display a plurality of devices, including the chain of interconnected devices and a circuit portion for integration intermediately into the chain of interconnected devices, the circuit portion including at least one electronic device;
   moving at least one of the graphically rendered plurality of devices to visually superimpose at least a portion of another, one over the other according to user indication of a desired insertion region within the chain of interconnected devices;
   detecting at least one edge overlap between the circuit portion and the chain of interconnected devices, the edge overlap being defined by an edge of the circuit portion and an intermediate portion of the chain of interconnected devices being disposed in superimposed relation;
   responsive to the detected edge overlap, selectively determining an insertion point on the intermediate portion of the chain of interconnected devices within the desired insertion region, the insertion point indicating at least one interconnection node between interconnected electronic devices of the chain;
   defining a plurality of chain segments within the chain of interconnected devices, wherein the chain segments are interconnected at each interconnection node indicated by the insertion point;
   inserting the circuit portion between the chain segments; and,
   generating interconnection between the circuit portion and chain segments to form a reconfigured chain.

2. The method as recited in claim 1, wherein the edge overlap denotes a design requirement violation requiring resolution for intermediate incorporation of the circuit portion into the chain of interconnected devices.

3. The method as recited in claim 1, wherein the generating interconnection includes decomposing the chain of interconnected devices into a plurality of chain segments at each interconnection node of the chain of interconnected devices indicated by the insertion point, inserting the circuit portion between the chain segments, and interconnecting the circuit portion and chain segments at each interconnection node.

4. The method as recited in claim 3, further comprising adaptively transforming at least one device in the plurality of chain segments or the circuit portion according to the set of predefined design requirements for generation of valid interconnection between the circuit portion and chain segments to form the reconfigured chain.

5. The method as recited in claim 1, wherein the generating interconnection includes:
   determining an order of devices selected from the chain segments and the circuit portion, the order of devices being determined according to the insertion point;
   removing the chain segments and the circuit portion from the circuit design; and,
   generating the reconfigured chain in the circuit design to include the devices of the chain segments and circuit portion in the determined order and in interconnected relation.

6. The method as recited in claim 2, wherein the chain of interconnected devices includes at least two electronic devices arranged in mutually abutted relation cooperatively sharing at least one interconnection node therebetween.

7. The method as recited in claim 6, further comprising establishing an abutment group object indicating each of the at least two electronic devices in abutted relation.

8. The method as recited in claim 7, further comprising:
   detecting a plurality of overlaps between the circuit portion and the chain of interconnected devices, the overlap being defined by a device of the circuit portion and a device of the chain being disposed in superimposed relation;
   generating a plurality of violation objects according to the design requirement violation, the violation objects being generated to indicate at least one device being overlapped, at least one device moved to trigger the design requirement violation, and an elemental portion of each device related to the design requirement violation.

9. The method as recited in claim 8, further comprising identifying the devices in the chain of interconnected devices and the circuit portion by iteratively surveying the plurality of violation objects for: (1) the devices indicated by the violation, and (2) other devices coupled to the indicated devices according to respective abut groups or a net list establishing interconnections amongst devices in the circuit design.

10. The method as recited in claim 9, wherein a violation map is constructed to maintain an ordered list of longitudinal positions along the chain of interconnected devices in the rendered circuit design respectively corresponding to the violation objects.

11. The method as recited in claim 10, wherein the edge overlap is identified by:
   selecting a first or last longitudinal position in the violation map according to a predetermined configuration;
   identifying the violation object corresponding with the selected longitudinal position;
   identifying an overlapped device in the chain of interconnected devices indicated by the violation object;
   identifying an elemental portion of the device indicated by the violation object; and,
   establishing the insertion point at the elemental portion of the intersected device indicated by the violation object corresponding to the selected first or last longitudinal position in the violation map.

12. The method as recited in claim 11, further comprising:
   establishing an ordered list of devices including at least one device from each of: the chain segments and the circuit portion; and,
   generating a reconfigured chain to replace the chain of interconnected devices and the circuit portion in the circuit design according to the ordered list of devices.

13. The method as recited in claim 11, wherein at least one of the circuit portion and the chain segments are adaptively reconfigured by selectively executing one or more of: a reordering of devices, a rotation of at least one device, a transformation of elemental portions of at least one device, a combination of devices into abutted pairs, a deconstruction of abutted pairs of devices, and a device movement to thereby automatically reconfigure the chain of interconnected devices for interconnection of the circuit portion between two devices of the chain of interconnected devices in design requirement-compliant manner.

14. A system for automatically reconfiguring a chain of interconnected devices established in a circuit design according to a set of predefined design requirements, the system comprising:
   a user interface module executing to graphically render on a display a plurality of devices, including the chain of interconnected devices and a circuit portion for integration intermediately into the chain of interconnected devices, the circuit portion including at least one electronic device;

a movement module operably coupled to the user interface module and executing to move at least one of the graphically rendered plurality of devices to visually superimpose at least a portion of another, one over the other according to user indication of a desired insertion region within the chain of interconnected devices;

a mapping module executing to:
  detect at least one edge overlap between the circuit portion and the chain of interconnected devices, the edge overlap being defined by an edge of the circuit portion and an intermediate portion of the chain of interconnected devices being disposed in superimposed relation; and,
  responsive to the detected edge overlap, selectively determining an insertion point on the intermediate portion of the chain of interconnected devices within the desired insertion region, the insertion point indicating at least one interconnection node between interconnected electronic devices of the chain of interconnected devices; and, a chain transformation module executing to:
  define a plurality of chain segments within the chain of interconnected devices, the chain segments being interconnected at each interconnection node indicated by the insertion point;
  inserting the circuit portion between the chain segments; and,
  generating interconnection between the circuit portion and chain segments to form a reconfigured chain.

15. The system as recited in claim 14, wherein the edge overlap denotes a design requirement violation requiring resolution for intermediate incorporation of the circuit portion into the chain of interconnected devices.

16. The system as recited in claim 14, wherein the generating interconnection includes decomposing the chain of interconnected devices into a plurality of chain segments at each interconnection node of the chain of interconnected devices indicated by the insertion point, inserting the circuit portion between the chain segments, and interconnecting the circuit portion and chain segments at each interconnection node.

17. The system as recited in claim 16, further executing the chain transformation module to adaptively transform at least one device in the plurality of chain segments or the circuit portion according to the set of predefined design requirements for generation of valid interconnection between the circuit portion and chain segments to form the reconfigured chain.

18. The system as recited in claim 14, wherein the chain of interconnected devices includes at least two electronic devices arranged in mutually abutted relation cooperatively sharing at least one interconnection node therebetween.

19. A method for automatically reconfiguring a chain of interconnected devices established in a circuit design according to a set of predefined design requirements, the method comprising:

(a) executing a processor to graphically display the circuit design including at least the chain of interconnected devices and a circuit portion for integration intermediately into the chain of interconnected devices, the circuit portion including at least one electronic device;

(b) responsive to a user instruction, moving the circuit portion into a superimposed overlapping relation with the chain of interconnected devices at an intermediate portion thereof to generate at least one violation of the set of predefined design requirements;

(c) identifying the at least one violation, the violation referencing a terminal of an overlapped device of the chain of interconnected devices and a terminal of a device of the circuit portion overlapping the device of the chain of interconnected devices;

(d) generating a map identifying a physical placement order of devices of the chain of interconnected devices;

(e) identifying in the map, a designated insertion point of the circuit portion within the chain of interconnected devices according to the at least one identified violation;

(f) reordering the devices in the map according to the predefined design requirements and the designated insertion point of the circuit portion within the pre-existing chain of interconnected devices; and, (g) automatically reconfiguring the chain of interconnected devices by disconnecting at least two interconnected devices of the chain and interposing for interconnection the circuit portion therewithin according to the ordered map, the devices of the chain of interconnected devices and the circuit portion being arranged in requirement-compliant manner.

20. The method as recited in claim 19, wherein the chain of interconnected devices extends in a longitudinal direction and at least two devices of the chain are established in mutually abutted relation cooperatively sharing at least one interconnection node therebetween.

* * * * *